United States Patent
Tanaka

(10) Patent No.: US 8,386,863 B2
(45) Date of Patent: Feb. 26, 2013

(54) SCANNING-CAPABLE LATCH DEVICE, SCAN CHAIN DEVICE, AND SCANNING METHOD WITH LATCH CIRCUITS

(75) Inventor: Tomohiro Tanaka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 267 days.

(21) Appl. No.: 12/805,560

(22) Filed: Aug. 5, 2010

(65) Prior Publication Data

US 2010/0313090 A1 Dec. 9, 2010

Related U.S. Application Data

(63) Continuation of application No. PCT/JP2008/054084, filed on Mar. 6, 2008.

(51) Int. Cl.
*G06F 11/00* (2006.01)
(52) U.S. Cl. ........................................ 714/726; 714/729
(58) Field of Classification Search .................. 714/726, 714/727, 729, 733, 734
See application file for complete search history.

(56) References Cited

U.S. PATENT DOCUMENTS

| | | | | |
|---|---|---|---|---|
| 5,457,698 A | * | 10/1995 | Segawa et al. | 714/731 |
| 6,606,720 B1 | | 8/2003 | Naffziger | |
| 6,895,061 B1 | * | 5/2005 | Stong | 375/354 |
| 7,038,494 B2 | * | 5/2006 | Morton | 326/93 |
| 7,278,076 B2 | * | 10/2007 | Zhang et al. | 714/726 |
| 2003/0066001 A1 | * | 4/2003 | Sera et al. | 714/726 |

FOREIGN PATENT DOCUMENTS

| | | |
|---|---|---|
| JP | 63-240118 | 10/1988 |
| JP | 3-58143 | 3/1991 |
| JP | 5-75401 | 3/1993 |
| JP | 10-125085 | 5/1998 |
| JP | 10-142297 | 5/1998 |
| JP | 2001-289916 | 10/2001 |
| JP | 2002-139545 | 5/2002 |
| JP | 2004-134628 | 4/2004 |

OTHER PUBLICATIONS

International Search Report for PCT/JP2008/054084, mailed Apr. 8, 2008.
Office Action, mailed Sep. 11, 2012, in corresponding Japanese Application No. 2010-501738.

* cited by examiner

*Primary Examiner* — Dieu-Minh Le
(74) *Attorney, Agent, or Firm* — Staas & Halsey LLP

(57) ABSTRACT

In a scanning-capable latch circuit, main latch circuits respectively corresponding to data inputs D1 to D4 are connected in series and, except the last-stage main latch circuit, the scanning output from each main latch circuit becomes the scanning input for the subsequent main latch circuit; while the scanning output from the last-stage main latch circuit becomes the scanning input for a slave latch circuit. Hence, in the scanning-capable latch circuit used in an information processing apparatus, the circuit area can be reduced and scanning can be performed with a small-scale circuit.

4 Claims, 7 Drawing Sheets

SCAN CHAIN

SCANNING-CAPABLE LATCH DEVICE, SCAN CHAIN DEVICE, AND SCANNING METHOD WITH LATCH CIRCUITS

CROSS-REFERENCE TO RELATED APPLICATION(S)

This application is a continuation of International Application No. PCT/JP2008/054084, filed on Mar. 6, 2008, the entire contents of which are incorporated herein by reference.

FIELD

The embodiment discussed herein is directed to a scanning-capable latch device that, inside an information processing apparatus including a sequential circuit, retains internal data and is able to scan the retained content; a scan chain device configured by serially connecting the scanning-capable latch devices; and a scanning method with latch circuits.

BACKGROUND

Typically, in an information processing apparatus including a sequential circuit, latch circuits (latch devices) synchronized by clock signals for retaining internal data are present in large numbers. In such latch circuits, with an aim to confirm whether the circuits are correctly manufactured or to confirm the internal data or to set arbitrary data inside the circuits, a popular practice is to configure in advance a scan chain in the circuits (for example, see Japanese Laid-open Patent Publication No. 2002-139545). The latch circuits with such a scanning function are referred to as scanning-capable latch circuits.

In FIG. 5 is illustrated a configuration of a conventional scanning-capable latch circuit 100. During normal system operations, data input from a data input terminal D illustrated in FIG. 5 is synchronized to clock signals CLK and XCLK and stored in a master circuit that functions as the main latch circuit. At the same time, the data is output from an output terminal MS.

During a scanning operation, clock signals ACK and XACK for scanning output switch to the ON state while the clock signals CLK and XCLK remain in the OFF state. Then, the data stored in the master circuit is copied into a slave circuit that functions as a slave latch circuit. At the same time, the data is output from a scanning result output terminal SO.

Moreover, when the clock signals ACK and XACK switch to the OFF state and clock signals BCK and XBCK for scanning input switch to the ON state, the data copied into the slave circuit is retained as it is and the data input from a scanning signal input terminal SI is loaded in the master circuit.

In FIG. 6 is illustrated a time chart of the conventional scanning operation. As illustrated in FIG. 6, the data in the master circuit is copied into and latched at the slave circuit by the clock signals ACK and XACK, while the scanning input is latched at the master circuit by the clock signals BCK and XBCK. This processing is equivalent to a single cycle.

In FIG. 7 is illustrated a scan chain that is configured by serially connecting m number of the scanning-capable latch circuit 100. Herein, scanning output SO from each scanning-capable latch circuit becomes scanning input SI for the subsequent scanning-capable latch circuit.

When the abovementioned single cycle is performed in the scan chain, the data gets shifted by a single bit. Thus, when switching ON/OFF of the clock signals ACK and BCK is repeated for the number of times equal to the number of latch circuits (with reference to FIG. 7, repeated for m number of times), it is possible to retrieve the internal data from the scanning result output terminal SO as well as it is possible to set data in an internal latch from the scanning signal input terminal SI.

However, in the conventional scanning-capable latch circuit, the entire slave circuit as well as a scanning-clock-signal input component inside the master circuit illustrated in FIG. 5 are configured solely for the purpose of scanning. Besides, from the perspective of system operations, the master circuit except the scanning-clock-signal input component would suffice. Hence, providing a scanning circuit on a latch causes a significant increase in the circuit area.

SUMMARY

According to an aspect of an embodiment of the invention, a scanning-capable latch device includes a plurality of main latch circuits that are allocated respectively to a plurality of data signals; and a slave latch circuit that scans the plurality of main latch circuits. Each of the main latch circuits includes a data input terminal for corresponding data signals, a data output terminal for corresponding data signals, a scanning input terminal for receiving scanning data, a scanning output terminal for outputting a scanning result, and a clock signal terminal for receiving a clock signal that controls timing of inputting scanning data into the corresponding main latch circuit. The main latch circuits are connected in series and, except a last-stage main latch circuit from among the main latch circuits, a scanning output from each main latch circuit becomes a scanning input for subsequent main latch circuit, while a scanning output from the last-stage main latch circuit becomes a scanning input for the slave latch circuit. The slave latch circuit includes a scanning input terminal for receiving the scanning input from the last-stage main latch circuit, a clock signal terminal for receiving a clock signal that controls signal input timing for the scanning input terminal, and a scanning result output terminal for outputting latch content of the slave latch circuit as a scanning result.

The object and advantages of the embodiment will be realized and attained by means of the elements and combinations particularly pointed out in the claims.

It is to be understood that both the foregoing general description and the following detailed description are exemplary and explanatory and are not restrictive of the embodiment, as claimed.

DESCRIPTION OF EMBODIMENT

A preferred embodiment of the present invention will be explained with reference to accompanying drawings.

Figure 1:
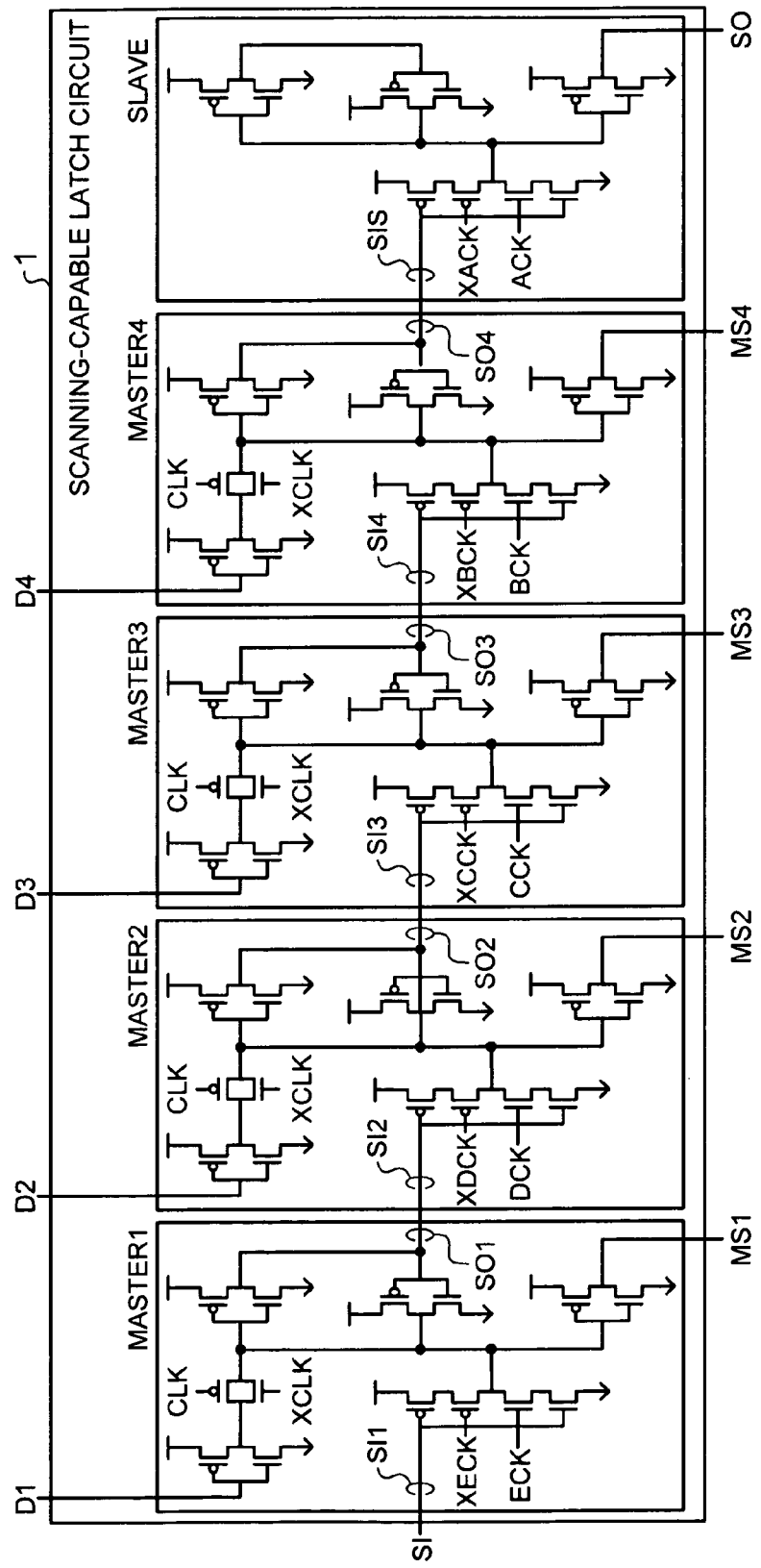
FIG. 1 is an outline configuration diagram of an outline configuration of a scanning-capable latch circuit according to an embodiment of the present invention.

FIG. 1 is an outline configuration diagram of an outline configuration of a scanning-capable latch circuit according to an embodiment of the present invention. As illustrated in FIG. 1, a scanning-capable latch circuit 1 is a circuit for latching four data inputs, and includes four data input terminals D1 to D4, four data output terminals MS1 to MS4, and four main latch circuits MASTER1 to MASTER4 that respectively correspond to the data input terminals D1 to D4 for latching data.

In addition, the scanning-capable latch circuit 1 includes a slave latch circuit SLAVE for scanning the latching result of the main latch circuits MASTER1 to MASTER4, includes a scanning input terminal SI, and includes a scanning result output terminal SO.

Figure 2:
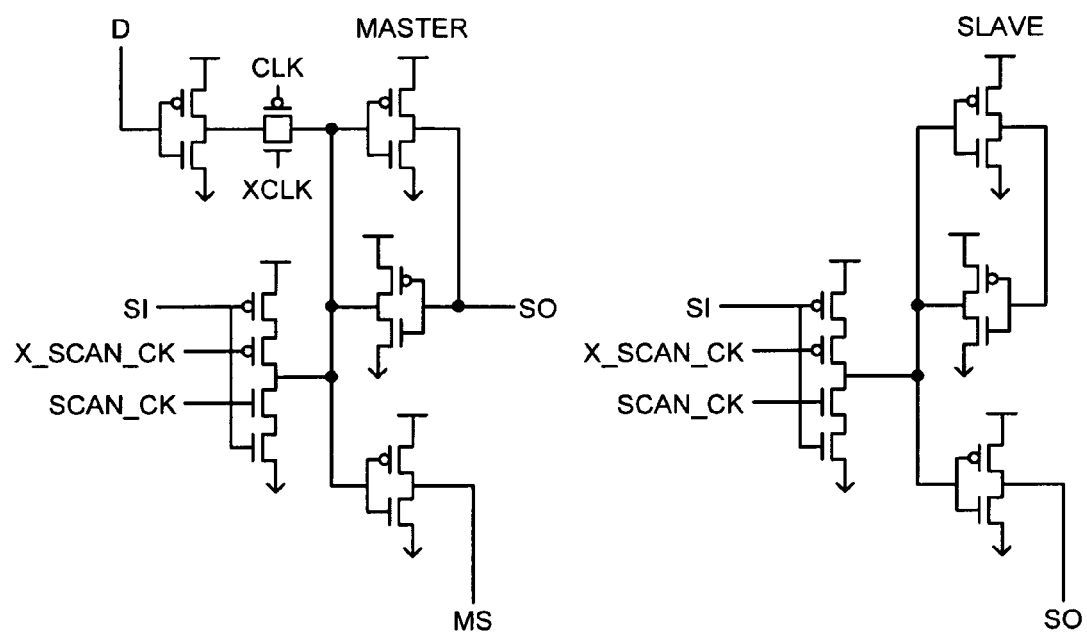
FIG. 2 is an explanatory diagram for explaining a configuration of a main latch circuit and a slave latch circuit according to the embodiment.

As illustrated in FIG. 2, the master latch circuits MASTER1 to MASTER4 and the slave latch circuit SLAVE have circuit configurations identical to the master circuit and the slave circuit, respectively, in the conventional technology.

The main latch circuit MASTER1 includes the data input terminal D1 and the data output terminal MS1 used for corresponding data signals as well as includes a scanning input terminal SI1 for receiving input of scanning data, a scanning output terminal SO1 for outputting the scanning result, and clock signal terminals for receiving clock signals ECK and XECK that control the timing of inputting the scanning data into the main latch circuit MASTER1.

Similarly, the main latch circuit MASTER2 includes the data input terminal D2 and the data output terminal MS2 used for corresponding data signals as well as includes a scanning input terminal SI2 for receiving input of scanning data, a scanning output terminal SO2 for outputting the scanning result, and clock signal terminals for receiving clock signals DCK and XDCK that control the timing of inputting the scanning data into the main latch circuit MASTER2.

The scanning input terminal SI1 of the main latch circuit MASTER1 receives scanning input SI from outside of the device. The scanning input terminal SI2 of the main latch circuit MASTER2 is connected to the scanning output terminal SO1 of the main latch circuit MASTER1 and receives, as scanning input to the main latch circuit MASTER2, the scanning output from the main latch circuit MASTER1.

The main latch circuit MASTER3 includes the data input terminal D3 and the data output terminal MS3 used for corresponding data signals as well as includes a scanning input terminal SI3 for receiving input of scanning data, a scanning output terminal SO3 for outputting the scanning result, and clock signal terminals for receiving clock signals CCK and XCCK that control the timing of inputting the scanning data into the main latch circuit MASTER3.

The scanning input terminal SI3 of the main latch circuit MASTER3 is connected to the scanning output terminal SO2 of the main latch circuit MASTER2 and receives, as scanning input to the main latch circuit MASTER3, the scanning output from the main latch circuit MASTER2.

The main latch circuit MASTER4 includes the data input terminal D4 and the data output terminal MS4 used for corresponding data signals as well as includes a scanning input terminal SI4 for receiving input of scanning data, a scanning output terminal SO4 for outputting the scanning result, and clock signal terminals for receiving clock signals BCK and XBCK that control the timing of inputting the scanning data into the main latch circuit MASTER4.

The scanning input terminal SI4 of the main latch circuit MASTER4 is connected to the scanning output terminal SO3 of the main latch circuit MASTER3 and receives, as scanning input to the main latch circuit MASTER4, the scanning output from the main latch circuit MASTER3.

The slave latch circuit SLAVE neither includes a data input terminal nor includes a data output terminal, but includes a scanning input terminal SIS for receiving input of scanning data, a scanning output terminal SO for outputting the scanning result, and clock signal terminals for receiving clock signals ACK and XACK that control the timing of inputting the scanning data into the slave latch circuit SLAVE.

The scanning input terminal SIS of the slave latch circuit SLAVE is connected to the scanning output terminal SO4 of the main latch circuit MASTER4 and receives, as scanning input to the slave latch circuit SLAVE, the scanning output from the main latch circuit MASTER4. Besides, as the scanning result of the scanning-capable latch circuit 1, scanning output SO from the slave latch circuit SLAVE is output without change to the outside.

Thus, the main latch circuits MASTER1 to MASTER4 are connected in series and, except the last-stage main latch circuit (herein, MASTER4), the scanning output from each main latch circuit becomes the scanning input for the subsequent main latch circuit; while the scanning output from the last-stage main latch circuit (herein, MASTER4) becomes the scanning input for the slave latch circuit SLAVE.

Hence, in the scanning-capable latch circuit 1, each of the main latch circuits MASTER2 to MASTER4 not only functions as the master circuit in the conventional technology but also functions as a slave latch circuit to the corresponding previous main latch circuit. Such a circuit configuration eliminates the need to provide an independent slave latch circuit corresponding to each main latch circuit and thus enables achieving reduction in the circuit area.

At the same time, regarding operation control, since the scanning-capable latch circuit 1 includes four main latch circuits and a single slave latch circuit connected in series; the operations are performed under the control of five scanning clock signals. Meanwhile, the number of main latch circuits is not limited to four as described above and can be arbitrarily set.

Thus, for n number of scanning clock signals, n−1 number of the main latch circuit MASTER are arranged and the scanning output terminal SO of each main latch circuit MASTER is connected to the scanning input terminal SI of the subsequent main latch circuit MASTER. Subsequently, a single slave latch circuit SLAVE is placed at the end and the scanning output terminal SO of the last main latch circuit MASTER is connected to the scanning input terminal SI of the slave latch circuit SLAVE. In the present description, the scanning-capable latch circuit 1 has the circuit configuration for the case of n=5 as the number of scanning clock signals.

If the number n representing the number of scanning clock signals is too large, then the circuit area for the scanning clock signals increases but the effect thereof decreases. However, if the number n is equal to about five, then it becomes possible to achieve a substantial decrease in the circuit area of a scanning-capable latch circuit.

Explained below are the operations performed by the scanning-capable latch circuit 1. Firstly, at the start of system operations, the clock signals ACK to ECK are in the OFF state. Hence, although the main latch circuits MASTER1 to MASTER4 are in the operating state, the slave latch circuit SLAVE remains idle.

Figure 3:
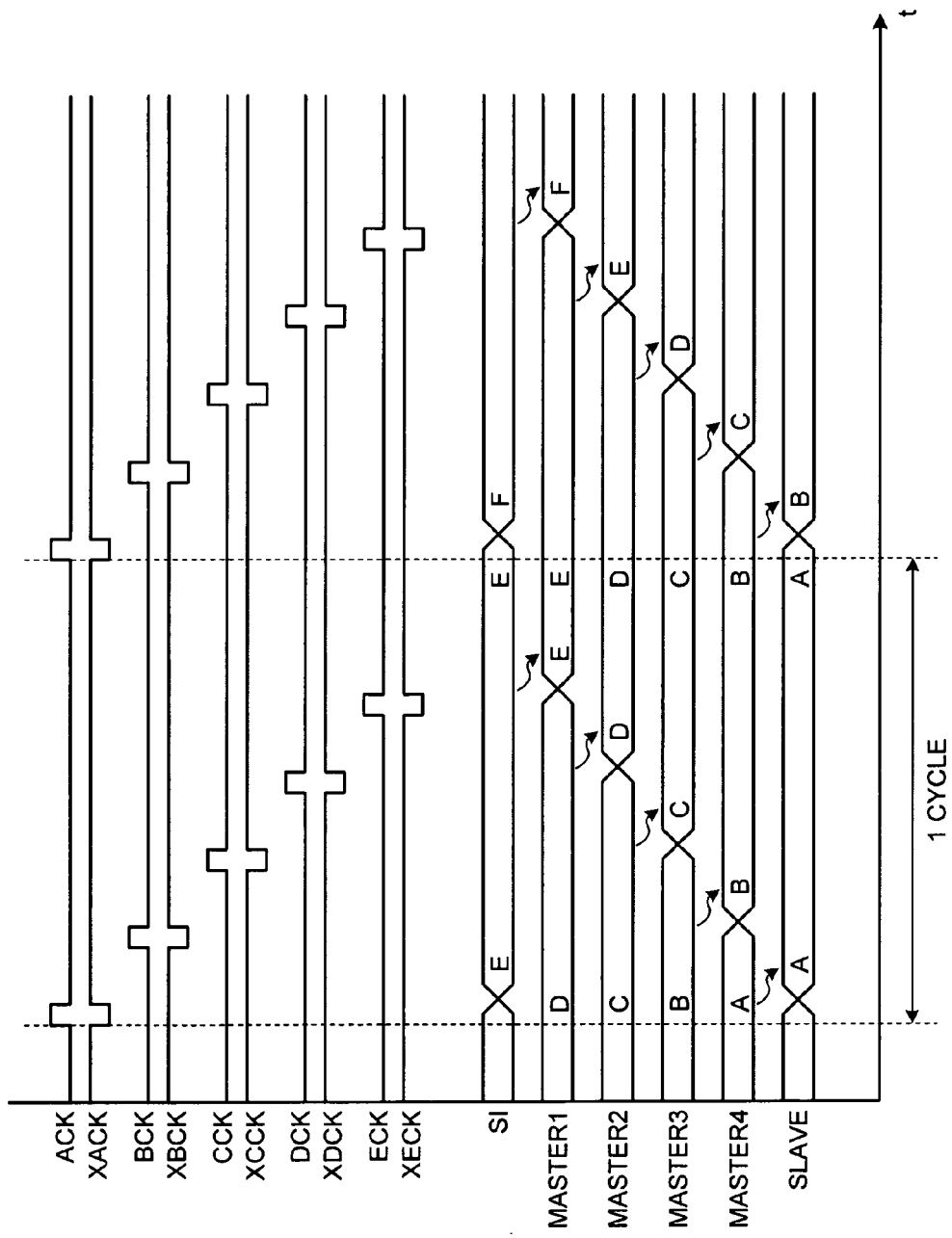
FIG. 3 is a time chart for explaining the operations performed by the scanning-capable latch device according to the embodiment.

During a scanning operation, in the OFF state of the clock signals CLK and XCLK; firstly, the clock signals ACK and XACK switch to the ON state as illustrated in a time chart in FIG. 3. As a result, the data stored in the main latch circuit MASTER4 is copied into the slave latch circuit SLAVE. Subsequently, the clock signals ACK and XACK switch to the OFF state and the clock signals BCK and XBCK switch to the ON state so that the data stored in the main latch circuit MASTER3 is copied into the main latch circuit MASTER4.

Repeating the same operation up to the clock signal ECK results in a scan shift. Thus, in the scanning-capable latch circuit 1, the sequential input of the clock signals ACK and XACK, the clock signals BCK and XBCK, the clock signals CCK and XCCK, the clock signals DCK and XDCK, and the clock signals ECK and XECK represents a single cycle.

Figure 4:
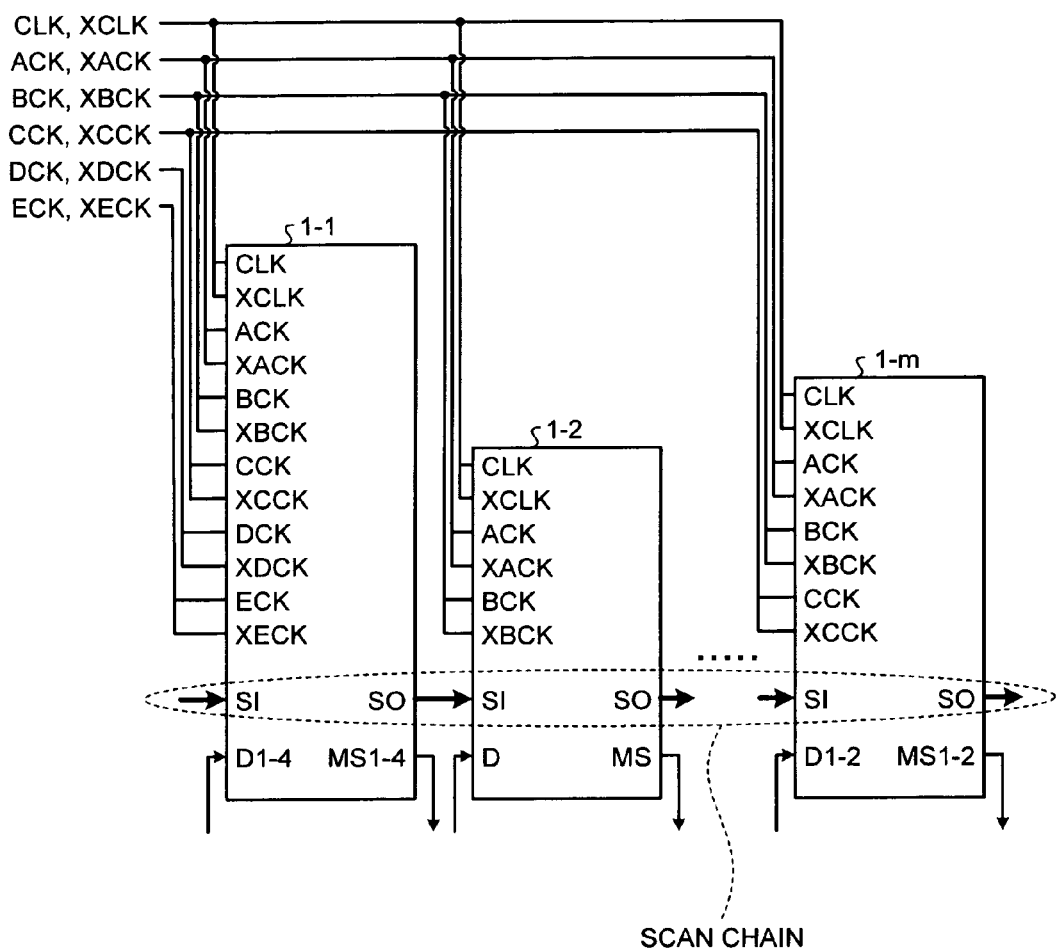
FIG. 4 is an outline configuration diagram of an outline configuration of a scan chain according to the embodiment.
Figure 5:
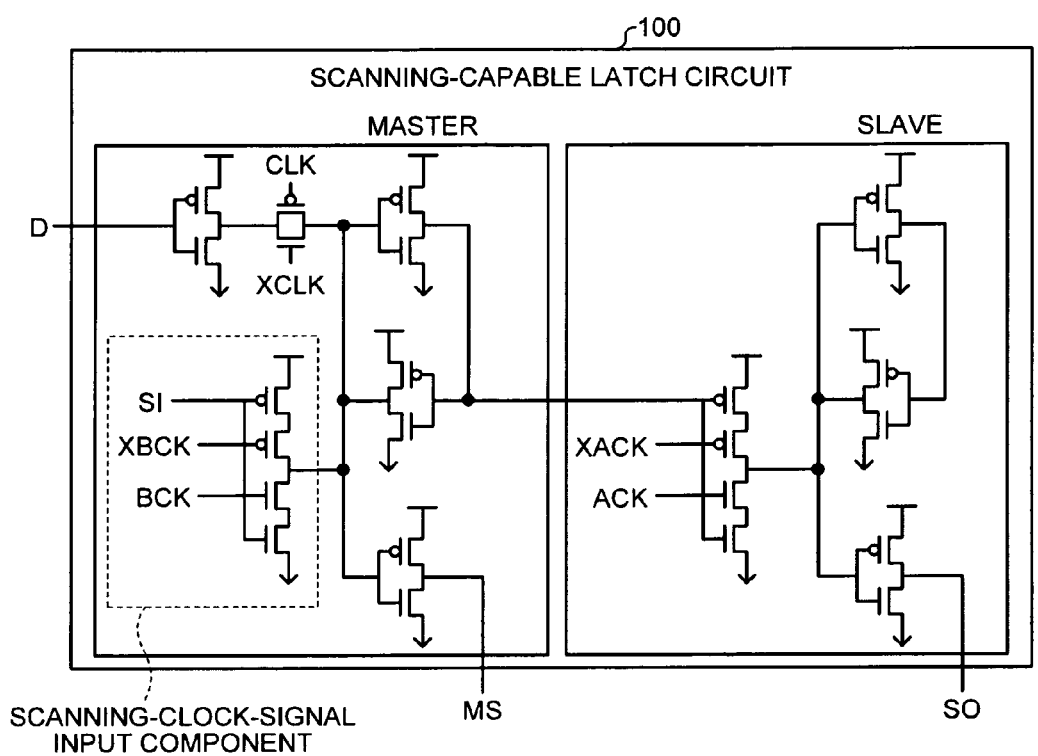
FIG. 5 is an outline configuration diagram of an outline configuration of a conventional scanning-capable latch circuit.
Figure 6:
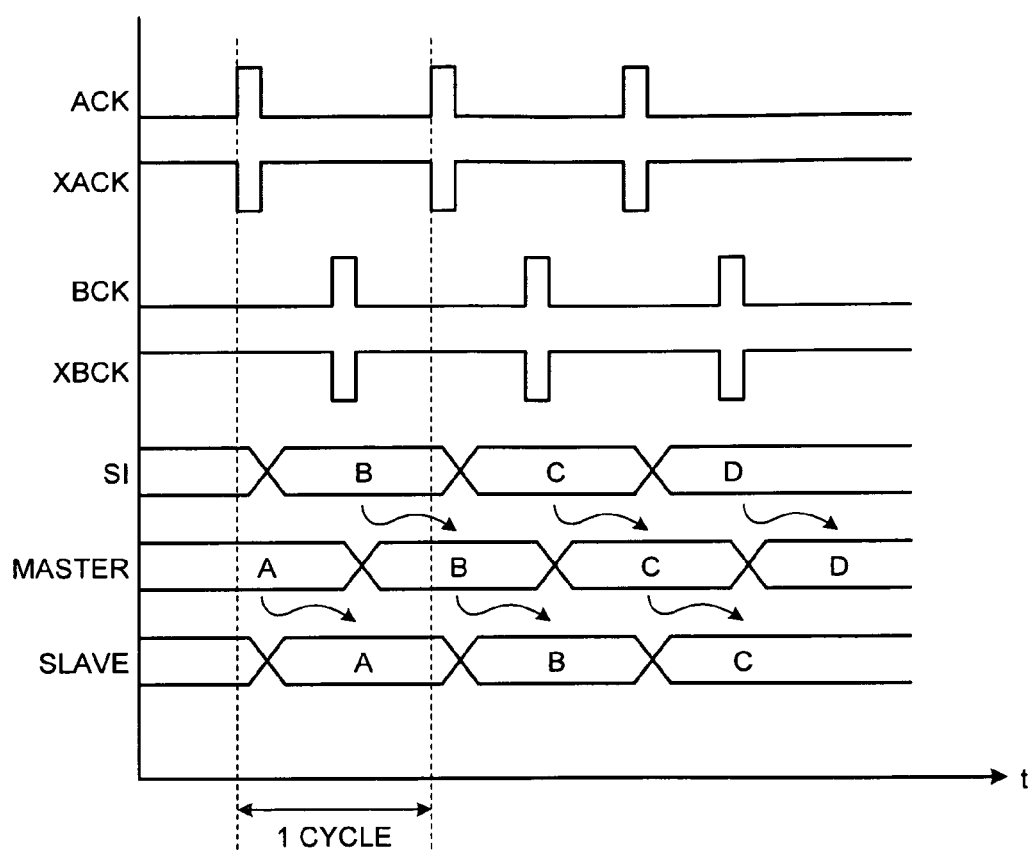
FIG. 6 a time chart for explaining the operations performed by the conventional scanning-capable latch circuit.
Figure 7:
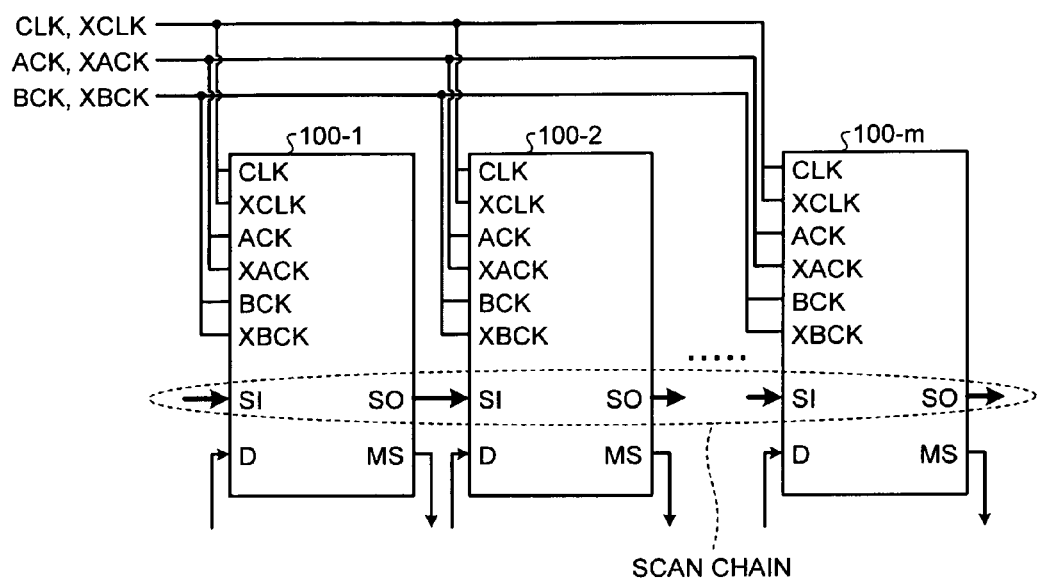
FIG. 7 is an outline configuration diagram of an outline configuration of a conventional scan chain.

In FIG. 4 is illustrated a scan chain that is configured by connecting scanning-capable latch circuits as illustrated in FIG. 1. In the configuration illustrated in FIG. 4, m number of scanning-capable latch circuits, namely, a scanning-capable latch circuit 1-1, a scanning-capable latch circuit 1-2, ..., and a scanning-capable latch circuit 1-m are connected in series.

In the scanning-capable latch circuit 1-1, the number of scanning clock signals is five (n=5); in the scanning-capable latch circuit 1-2, the number of scanning clock signals is two (n=2); and in the scanning-capable latch circuit 1-m, the number of scanning clock signals is three (n=3). Thus, the scan chain can be configured by connecting scanning-capable latch circuits each having a different number of scanning clock signals.

In such a case, the number of scanning clock signals with respect to the entire scan chain is set to the maximum number of scanning clock signals for a single scanning-capable latch circuit (i.e., with reference to FIG. 4, the maximum number of scanning clock signals is five (n=5) for the scanning-capable latch circuit 1-1).

Even if the scan chain is configured by connecting scanning-capable latch circuits each having a different number of scanning clock signals, the scan shift can be achieved without problems. The reason for that is as follows. In each scanning-capable latch circuit, when the clock signals ACK and XACK switch to the ON state, the scanning-capable latch circuit outputs the data to be shifted from the corresponding scanning result output terminal SO. Besides, the scanning-capable latch circuit having two scanning clock signals (n=2) loads the data to be shifted from the clock signals BCK and XBCK; the scanning-capable latch circuit having three scanning clock signals (n=3) loads the data to be shifted from the clock signals CCK and XCCK; the scanning-capable latch circuit having four scanning clock signals (n=4) loads the data to be shifted from the clock signals DCK and XDCK; and the scanning-capable latch circuit having five scanning clock signals (n=5) loads the data to be shifted from the clock signals ECK and XECK.

As described above, in the scanning-capable latch circuit 1 according to the present embodiment, the main latch circuits MASTER1 to MASTER4 are connected in series and, except the last-stage main latch circuit (herein, MASTER4), the scanning output from each main latch circuit becomes the scanning input for the subsequent main latch circuit; while the scanning output from the last-stage main latch circuit (herein, MASTER4) becomes the scanning input for the slave latch circuit SLAVE. Hence, in the scanning-capable latch circuit used in an information processing apparatus, the circuit area can be reduced and scanning can be performed with a small-scale circuit.

According to an aspect of the present invention, it is possible to provide a scanning-capable latch device, a scan chain device, and a scanning method with latch circuits that enable achieving reduction in the circuit area and enable performing scanning with a small-scale circuit.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A scanning-capable latch device comprising:
   a plurality of main latch circuits that are allocated respectively to a plurality of data signals; and
   a slave latch circuit that scans the plurality of main latch circuits, wherein
   each of the main latch circuits includes
       a data input terminal for corresponding data signals,
       a data output terminal for corresponding data signals,
       a scanning input terminal for receiving scanning data,
       a scanning output terminal for outputting a scanning result, and
       a clock signal terminal for receiving a clock signal that controls timing of inputting scanning data into the corresponding main latch circuit,
   the main latch circuits are connected in series and, except a last-stage main latch circuit from among the main latch circuits, a scanning output from each main latch circuit becomes a scanning input for subsequent main latch circuit, while a scanning output from the last-stage main latch circuit becomes a scanning input for the slave latch circuit, and
   the slave latch circuit includes
       a scanning input terminal for receiving the scanning input from the last-stage main latch circuit,
       a clock signal terminal for receiving a clock signal that controls signal input timing for the scanning input terminal, and
       a scanning result output terminal for outputting latch content of the slave latch circuit as a scanning result.

2. A scan chain device configured by serially connecting a plurality of scanning-capable latch devices, wherein
   each of the scanning-capable latch devices comprises:
       a plurality of main latch circuits that are allocated respectively to a plurality of data signals; and
       a slave latch circuit that scans the plurality of main latch circuits, wherein
       each of the main latch circuits includes
           a data input terminal for corresponding data signals,
           a data output terminal for corresponding data signals,
           a scanning input terminal for receiving scanning data,
           a scanning output terminal for outputting a scanning result, and
           a clock signal terminal for receiving a clock signal that controls timing of inputting scanning data into the corresponding main latch circuit,
       the main latch circuits are connected in series and, except a last-stage main latch circuit from among the main latch circuits, a scanning output from each main latch circuit becomes a scanning input for subsequent main latch circuit, while a scanning output from the last-stage main latch circuit becomes a scanning input for the slave latch circuit, the slave latch circuit includes
- a scanning input terminal for receiving the scanning input from the last-stage main latch circuit,
- a clock signal terminal for receiving a clock signal that controls signal input timing for the scanning input terminal, and
- a scanning result output terminal for outputting latch content of the slave latch circuit as a scanning result, except a last-stage scanning-capable latch device from among the scanning-capable latch devices, a scanning result output of each scanning-capable latch device becomes a scanning input for a first main latch circuit from among the main latch circuits in subsequent scanning-capable latch device, and a scanning result output of the last-stage scanning-capable latch device represents a scan chain output.

3. The scan chain device according to claim 2, wherein the scanning-capable latch devices serially connected in the scan chain device differ from each other in a number of main latch circuits.

4. A scanning method for latch circuits that includes a plurality of main latch circuits that are serially connected to each other and a slave latch circuit that scans the plurality of main latch circuits, the main latch circuits being allocated respectively to a plurality of data signals and being connected to the slave latch circuit at last stage, the scanning method comprising:

obtaining a scanning result output by passing a clock signal to the slave latch circuit; and shifting latch content to a subsequent latch circuit by passing a clock signal to a previous latch circuit to the latch circuit passed with the clock signal, wherein the shifting is repeated for a number of times equal to a number of the main latch circuits.

* * * * *